United States Patent
Zhang et al.

(10) Patent No.: US 9,536,040 B2
(45) Date of Patent: *__Jan. 3, 2017__

(54) METHODS FOR DESIGNING AN EXHAUST ASSEMBLY FOR A VEHICLE

(71) Applicant: Ford Global Technologies, LLC, Dearborn, MI (US)

(72) Inventors: Yahong Zhang, Canton, MI (US); Craig Richard Wetzel, Dearborn, MI (US); Jeremy Howe, Grosse Ile, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 486 days.

This patent is subject to a terminal disclaimer.

(21) Appl. No.: 14/092,238

(22) Filed: Nov. 27, 2013

(65) Prior Publication Data

US 2014/0316749 A1  Oct. 23, 2014

Related U.S. Application Data

(63) Continuation-in-part of application No. 13/865,459, filed on Apr. 18, 2013, now Pat. No. 9,328,648.

(51) Int. Cl.
*G06F 7/60* (2006.01)
*G06F 17/10* (2006.01)
*G06F 17/50* (2006.01)
*F01N 13/20* (2010.01)
*F01N 13/08* (2010.01)

(52) U.S. Cl.
CPC ......... *G06F 17/5095* (2013.01); *F01N 13/082* (2013.01); *F01N 13/20* (2013.01)

(58) Field of Classification Search
CPC ..... G06F 17/5095; F01N 13/082; F01N 13/20
USPC .......................................................... 703/2
See application file for complete search history.

(56) References Cited

U.S. PATENT DOCUMENTS

| | | | |
|---|---|---|---|
| 2,841,232 A | 7/1958 | Loeffler | |
| 2,850,314 A | 9/1958 | Haigh et al. | |
| 2,854,278 A | 9/1958 | Zerhan, Jr. | |
| 2,856,020 A | 10/1958 | Hoagg et al. | |
| 2,864,406 A | 12/1958 | Schewel | |
| 2,868,229 A | 1/1959 | Russell | |
| 2,902,102 A * | 9/1959 | Gorman | B60K 13/06 180/309 |
| 2,919,720 A | 1/1960 | Nicholls | |
| 2,951,724 A | 9/1960 | Morrish et al. | |

(Continued)

FOREIGN PATENT DOCUMENTS

| | | |
|---|---|---|
| DE | 19651608 A1 | 6/1998 |
| DE | 10136350 A1 | 2/2003 |

(Continued)

*Primary Examiner* — Dwin M Craig
(74) *Attorney, Agent, or Firm* — Jason Rogers; Price Heneveld LLP

(57) ABSTRACT

A method of designing an exhaust assembly that includes the steps: developing an initial exhaust assembly design; evaluating the initial design based on a design guide; developing an interim exhaust assembly design, or a plurality of interim exhaust assembly designs, based on the initial design and a parametric model; evaluating the interim design or designs using a computational fluid dynamics model; and developing a final exhaust assembly design based on the parametric and the fluid dynamics models.

10 Claims, 13 Drawing Sheets

(56) References Cited

U.S. PATENT DOCUMENTS

| | | | |
|---|---|---|---|
| 2,979,357 A | 4/1961 | Leach et al. | |
| 2,992,035 A | 7/1961 | Tell et al. | |
| 3,043,097 A | 7/1962 | Inman et al. | |
| 6,098,589 A * | 8/2000 | Klenk | F02B 17/005 123/295 |
| 6,209,794 B1 * | 4/2001 | Webster | G06F 17/5095 236/78 B |
| 6,595,318 B2 | 7/2003 | Ebinger et al. | |
| 6,827,173 B2 | 12/2004 | Lai | |
| 6,962,230 B2 | 11/2005 | Hanaya et al. | |
| 7,007,720 B1 | 3/2006 | Chase et al. | |
| 7,032,702 B2 | 4/2006 | Rinklin | |
| D539,716 S | 4/2007 | Kulla | |
| D559,753 S | 1/2008 | Pfeiffer | |
| D584,199 S | 1/2009 | Leclercq | |
| 7,526,358 B2 | 4/2009 | Kawano et al. | |
| 7,558,713 B2 | 7/2009 | Kumar | |
| 7,604,092 B2 | 10/2009 | Fritz | |
| 7,735,885 B2 | 6/2010 | Shin | |
| 7,823,938 B2 | 11/2010 | McKee et al. | |
| 7,874,150 B2 | 1/2011 | Stadler et al. | |
| 7,891,452 B2 | 2/2011 | Iwamoto et al. | |
| 8,312,961 B2 | 11/2012 | Won et al. | |
| 8,443,928 B2 | 5/2013 | Chang | |
| 8,550,122 B2 | 10/2013 | Derry et al. | |
| 8,695,754 B2 | 4/2014 | Iiyama et al. | |
| 8,733,086 B2 | 5/2014 | Han | |
| 8,863,886 B2 | 10/2014 | O'Brien et al. | |
| 8,875,836 B2 | 11/2014 | Park et al. | |
| 2002/0053483 A1 | 5/2002 | Ebinger et al. | |
| 2003/0057008 A1 * | 3/2003 | Lai | F01N 13/082 180/309 |
| 2003/0231506 A1 | 12/2003 | Chen | |
| 2004/0163874 A1 * | 8/2004 | Rinklin | B60K 13/04 180/309 |
| 2005/0288807 A1 * | 12/2005 | Tooman | B29C 45/2725 700/97 |
| 2008/0036222 A1 | 2/2008 | Iwamoto et al. | |
| 2013/0026749 A1 | 1/2013 | O'Brien et al. | |
| 2014/0311609 A1 | 10/2014 | Nowka et al. | |
| 2014/0316749 A1 | 10/2014 | Zhang et al. | |
| 2014/0374514 A1 | 12/2014 | Kieslich | |
| 2015/0136515 A1 | 5/2015 | Nowka et al. | |

FOREIGN PATENT DOCUMENTS

| | | |
|---|---|---|
| EP | 2072775 A1 | 6/2009 |
| JP | 07121208 | 5/1995 |
| JP | 2002097947 | 4/2002 |
| JP | 2004239131 | 8/2004 |
| JP | 2006076367 | 3/2006 |
| JP | 20100254256 | 11/2010 |
| JP | 2011025768 | 10/2011 |
| KR | 20100051380 A | 5/2010 |
| KR | 20130048861 A | 5/2013 |

* cited by examiner

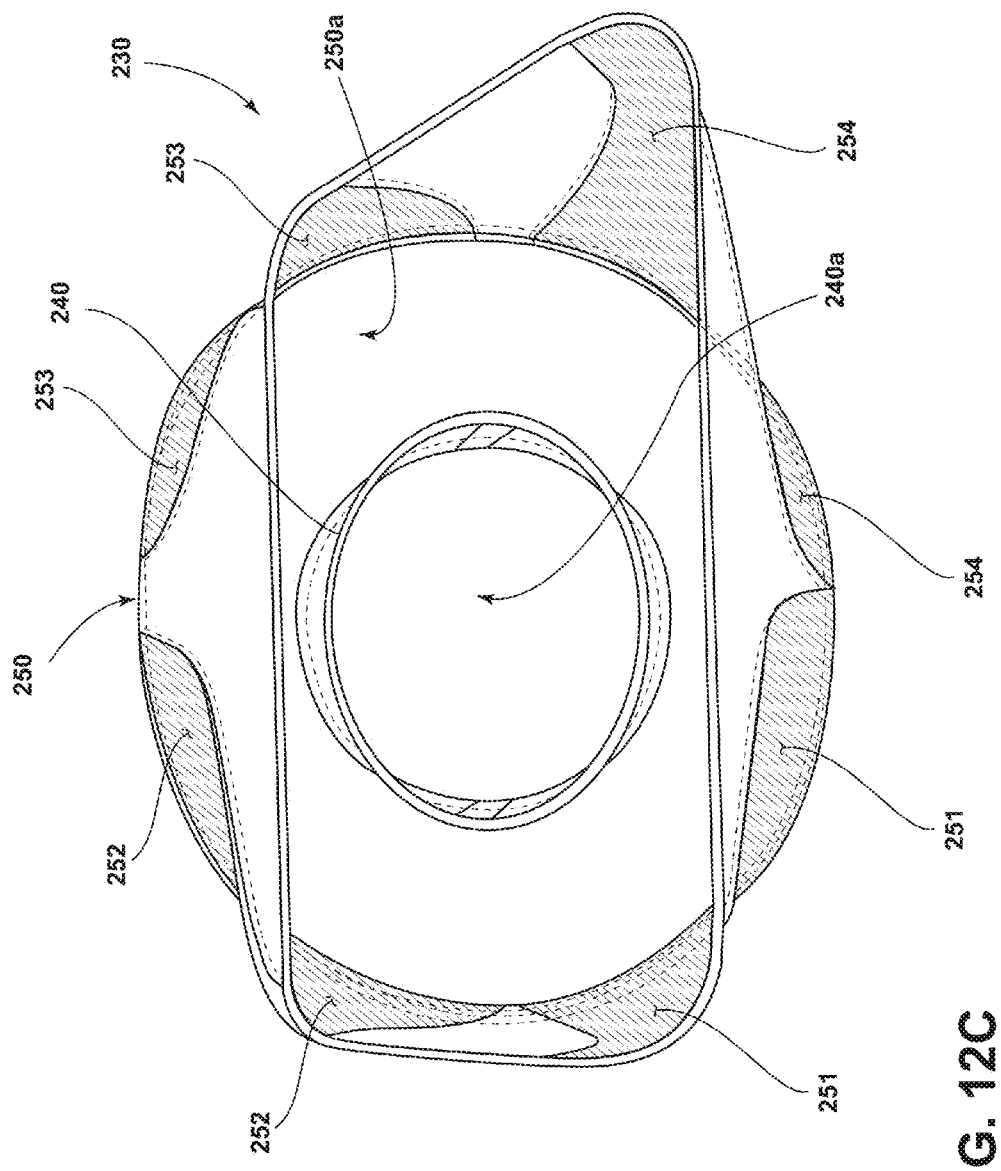

METHODS FOR DESIGNING AN EXHAUST ASSEMBLY FOR A VEHICLE

CROSS-REFERENCE TO RELATED APPLICATION

This application is a continuation-in-part of U.S. patent application Ser. No. 13/865,459, filed on Apr. 18, 2013, entitled "PROTECTIVE SHIELD TO REDUCE EXHAUST SOOT AND CONDENSATE DEPOSITION," now issued as U.S. Pat. No. 9,328,648 on May 3, 2016. The aforementioned related application is hereby incorporated by reference.

FIELD OF THE INVENTION

The present invention generally relates to exhaust assemblies for vehicular applications and, more particularly, to exhaust assemblies suitable for use in through-fascia, decorative exhaust tip and other vehicular exhaust system designs, along with methods of designing them.

BACKGROUND OF THE INVENTION

Many vehicles currently employ exhaust systems with decorative features in close proximity to the tailpipe and related components. Often these decorative features are curved and in close proximity to exhaust soot and condensate emanating from the tailpipe of vehicles during operation. The exhaust soot and/or condensate often deposits, discolors and otherwise adversely impacts these decorative features. Customer dissatisfaction is one adverse impact associated with these effects.

Vehicles with gasoline turbocharged direct injection (GTDI) engines are particularly prone to this problem. These engines produce high levels of carbon soot due to the level of enrichment required to maintain an acceptable throttle response under wide open throttle conditions. This soot exits the tailpipe as gas-borne and condensate-borne particulate. Both mechanisms of soot contribute to high rates of soot accumulation on the vehicle surfaces in close proximity to the tailpipe, particularly decorative exhaust tips and/or rear fascia. These soot accumulation rates are higher in vehicles with GDTI engines as compared to vehicles with non-GDTI engines.

Often the design of exhaust assemblies for a vehicle is driven in significant part by aesthetic considerations with various engineering constraints governed by the power systems and other aspects of the drive system selected for a given vehicle. Conventional methods of designing exhaust assemblies are iterative and rely on numerous computer aided design (CAD)-models that are tested using computational fluid dynamics (CFD) simulation models. Typically, these CAD models are developed on a time consuming element-by-element basis and then repeatedly tested through computer simulations. Considerations related to soot accumulation and discoloration are not understood through these conventional computer simulations. Often, only expensive prototype testing uncovers these problems late in the design cycle.

Accordingly, there is a need for exhaust assemblies that eliminate and/or mitigate the adverse effects associated with soot accumulation, discoloration and the like on the surfaces of a vehicle in proximity to the tailpipe. There is also a need for a more efficient model and approach to designing exhaust assemblies for vehicles in view of these adverse effects and other engineering considerations.

SUMMARY OF THE INVENTION

One aspect of the present invention is to provide an exhaust assembly that includes an exhaust pipe extending rearward from a vehicle into an exhaust passage, and a fascia coupled to the vehicle defining the exhaust passage. The exhaust assembly further includes a bezel defining an exhaust opening substantially aligned with the pipe, and a sleeve configured within the exhaust opening. The sleeve extends rearward to at least the rearmost portion of the exhaust opening and substantially parallel to an exit portion of the pipe.

Another aspect of the present invention is to provide an exhaust assembly that includes an exhaust pipe with an orifice extending rearward from a vehicle into an exhaust passage, and a fascia coupled to the vehicle defining the exhaust passage. The exhaust assembly further includes a bezel defining an exhaust opening substantially aligned with the orifice, and an upper and a lower sleeve configured within the opening. The opening defines an exhaust plane, and the sleeves extend rearward to at least the plane and substantially parallel to the orifice.

A further aspect of the present invention is to provide an exhaust assembly that includes an exhaust pipe extending rearward from a vehicle, and a fascia coupled to the vehicle. The exhaust assembly further includes an upper and a lower bezel coupled to the fascia defining an exhaust opening, and an upper and a lower sleeve configured within the opening substantially aligned with the pipe. The upper sleeve extends rearward to a line tangent to the rearmost surfaces of the upper bezel and perpendicular to the upper sleeve.

An additional aspect of the present invention is to provide a method of designing an exhaust assembly. The method includes the steps: developing an initial exhaust assembly design; evaluating the initial design based on a design guide; developing an interim exhaust assembly design based on the initial design and a parametric model; evaluating the interim design using a computational fluid dynamics model; and developing a final exhaust assembly design based on the parametric and the fluid dynamics models.

Another aspect of the present invention is to provide a method of designing an exhaust assembly. The method includes the steps: developing an initial exhaust assembly design; evaluating the initial design based on a design guide; developing a plurality of interim exhaust assembly designs based on the initial design and a parametric model; evaluating the plurality of interim exhaust assembly designs using a computational fluid dynamics model; and developing a final exhaust assembly design based on the parametric and the fluid dynamics models.

A further aspect of the present invention is to provide a method of designing an exhaust assembly. The method includes the steps: developing an initial design having (a) an exhaust pipe extending rearward from a vehicle, (b) a bezel defining an exhaust opening substantially aligned with the pipe, and (c) a bezel shield configured within the opening that extends rearward to at least the rearmost portion of the opening and substantially parallel to an exit portion of the pipe; and evaluating the initial design based on a design guide.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 12C is a cross-sectional rear view of the interim exhaust assembly design depicted in FIG. 12A.

DETAILED DESCRIPTION OF THE PREFERRED EMBODIMENTS

Figure 1:
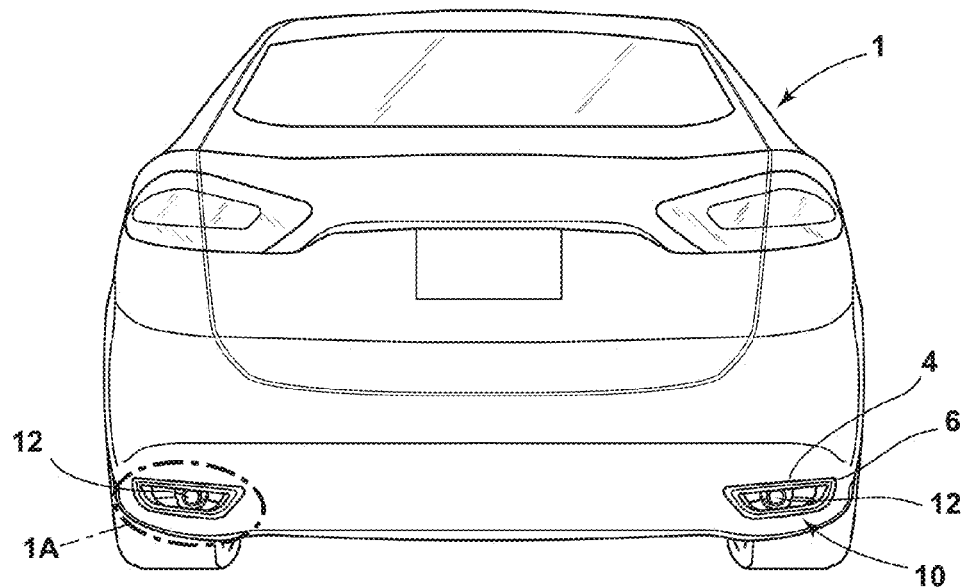
FIG. 1 is a rear, perspective view of a vehicle with an exhaust assembly with a trapezoidal shaped bezel and sleeve according to one embodiment.

For purposes of description herein, the terms "upper," "lower," "right," "left," "rear," "front," "vertical," "horizontal," and derivatives thereof shall relate to the invention as oriented in FIGS. 1, 1A, 7, 11B and 12C. Further, the terms "forward," and "rearward," shall relate to the invention as oriented in FIGS. 2-6, 7A, 11A, 11C, 12A and 12B relative to the forward and rearward directions associated with a vehicle, respectively. However, the invention may assume various alternative orientations, except where expressly specified to the contrary. Also, the specific devices illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Various exhaust assemblies are employed today to practical effect in directing noxious exhaust constituents away from the vehicle and its occupants during operation. But these assemblies tend to cause accumulation of soot on the rear, exterior surfaces of the vehicle, particularly in those vehicles with GDTI engines and through-fascia or decorative exhaust tip designs. Merely projecting the tailpipe farther away from these surfaces can minimally address the problem, but favorable results are only obtained with significant extensions of the tailpipe away from the vehicle fascia, for example. Unfortunately, it is not aesthetically pleasing to many consumers to move the tailpipe of the vehicle significantly rearward from the fascia, bumper and other rear vehicle components. Further, moving the tailpipe rearward in this fashion adds length to the vehicle, making parking more difficult. Still further, federal regulations aimed at pedestrian safety can limit the extent to which a vehicle designer can move the tailpipe away from the rear components of the vehicle.

Certain mechanisms drive soot accumulation on the exterior surfaces of the vehicle in proximity to the tailpipe (or tailpipes) connected to the vehicle exhaust system. Exhaust that emanates from the vehicle in the rearward direction tends to follow the exterior surfaces of the vehicle, particularly curved surfaces in proximity to the tailpipe. This mechanism is associated with the Coandă effect—i.e., the tendency of fluid jets to be attracted to nearby surfaces. Airflow tends to be bent toward nearby surfaces according to the Coandă effect. Consequently, exhaust flow, and particularly gas-borne and condensate-borne soot, tends to be bent toward nearby exterior surfaces of the vehicle. In turn, this effect leads to the accumulation of unwanted soot on these surfaces. Consequently, vehicles with decorative fascia and decorative exhaust tips are particularly prone to these effects.

It is now understood that straight surfaces along the exhaust path in proximity to curved rear vehicle features (e.g., fascia) tend to break up the exhaust flow, thereby shielding the exterior curved surfaces from soot accumulation. In effect, shielding elements placed inside of an exhaust opening can cause the exhaust flow gases to be dragged by shearing forces along the surfaces defined by these elements, away from the curved exterior surfaces of the vehicle. As a result, soot accumulation is significantly reduced on these surfaces.

Referring to FIG. 1, an exhaust assembly 10 is depicted as mounted on the rear portion of vehicle 1 according to an embodiment. Assembly 10 is configured according to the foregoing principles to mitigate Coandă-related soot accumulation effects on the rear exterior surfaces of the vehicle 1. The assembly 10 includes rear fascia 4 coupled to vehicle 1 in proximity to a rear bumper (not shown). Exhaust assembly 10 also includes an exhaust pipe 12 extending rearward from vehicle 1. The exhaust assembly 10 further includes a bezel 6 located within the fascia 4, and that is substantially aligned with the exhaust pipe 12.

Figure 2:
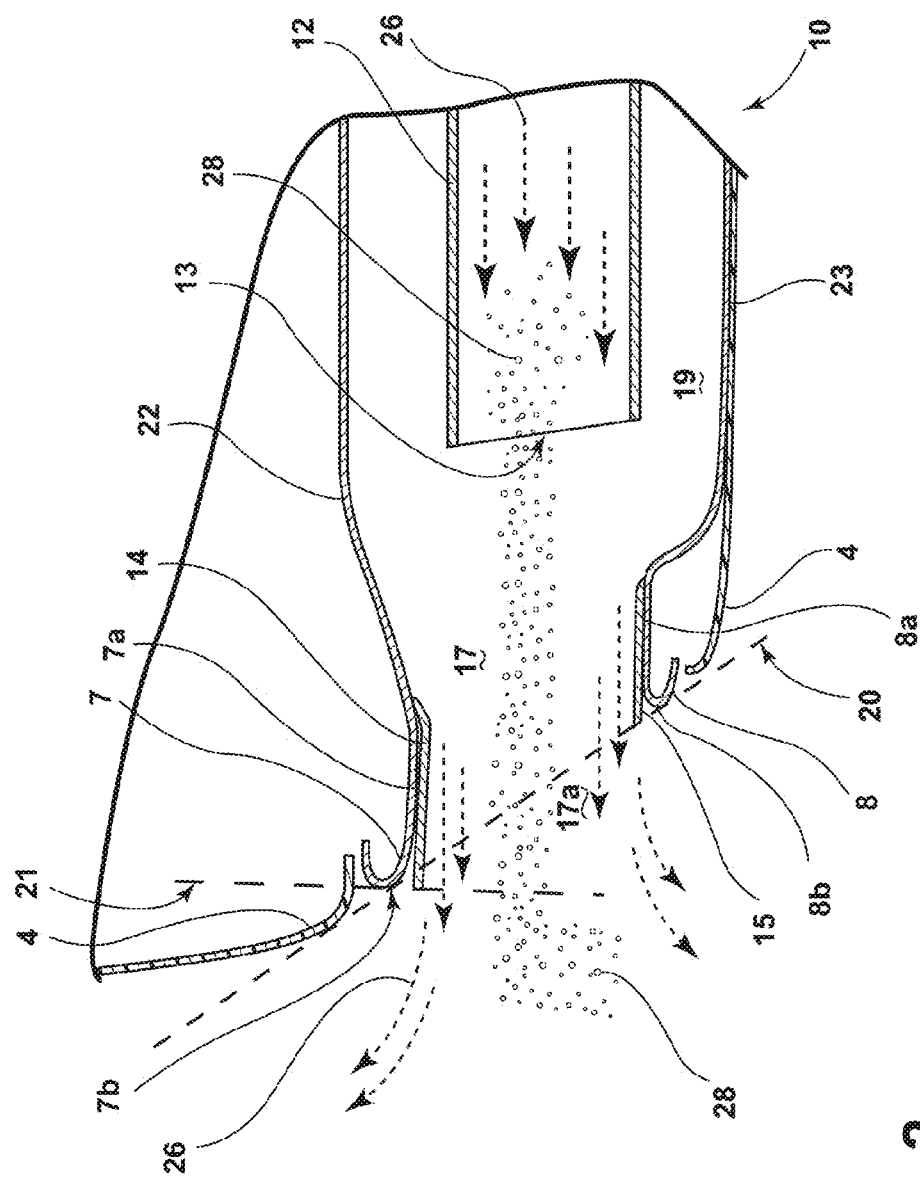
FIG. 2 a cross-sectional view of an exhaust assembly with a bezel and a sleeve according to another embodiment.

To further illustrate the foregoing principles and aspects, a cross-section of an exhaust assembly 10 is depicted in FIG. 2. Exhaust pipe 12 extends in the rearward direction toward the left side of FIG. 2 into an exhaust passage 19. The pipe 12 defines an exit portion 13. Exit portion 13 may be in the form of an orifice or other opening substantially parallel to the primary longitudinal axis of pipe 12. Exhaust gas 26 and exhaust condensate 28, both containing soot, emanate from the pipe 12 as shown. The exhaust gas 26 and condensate 28 both continue to flow in the rearward direction through exhaust passage 19, exiting the vehicle 1 (not shown). Exhaust passage 19 is roughly defined by fascia 4 and further includes an exhaust opening 17. The gas 26 and condensate 28 flow through opening 17 during operation of the vehicle 1.

The exhaust assembly 10, as depicted in FIG. 2, manages and directs the flow of exhaust gas 26 and exhaust condensate 28 to minimize accumulation of soot on exterior surfaces of the vehicle 1 (not shown), such as fascia 4. The bezel 6 (see FIG. 1) of assembly 10 is divided into an upper bezel 7 and lower bezel 8 (FIG. 2). Upper bezel 7 and lower bezel 8 define the exhaust opening 17, substantially aligned with exhaust pipe 12 and the exit portion of the pipe 13. Further, upper bezel 7 and lower bezel 8 may be coupled to vehicle 1 by a variety of means, such as upper heat shield 22 and lower heat shield 23. As shown in FIG. 2, upper bezel 7 is integral with upper heat shield 22; however, upper bezel 7 may be welded, riveted or otherwise connected to shield 22 as a separate piece. Similarly, lower bezel 8 is shown integral with lower heat shield 23, but may also be welded, riveted, or otherwise connected to it as a separate piece. It should also be apparent that bezel 6 may be formed in a unibody construction, without upper and lower elements.

Exhaust assembly 10 further includes a sleeve 16 (see FIG. 1A) that can comprise upper sleeve 14 and lower sleeve 15 portions, all located within exhaust opening 17 (see FIG. 2). The sleeve 16 can be coupled to the bezel 6 (see FIG. 1A) and, more particularly, the upper sleeve 14 and lower sleeve 15 can be coupled to the upper and lower bezels 7 and 8, respectively (FIG. 2). This coupling, e.g., between the bezel 6 and sleeve 16 (FIG. 1A), can be accomplished through welding, interference fits, riveting, or other attachment methods as understood by those skilled in the field. As further depicted in FIG. 2, the upper sleeve 14 and lower sleeve 15 each extend rearward to at least the rearmost portion of the exhaust opening 17a. As also depicted in FIG. 2, upper bezel 7 and lower bezel 8 each may include curved, rearmost surfaces 7b and 8b, respectively, which define the rearmost portion of exhaust opening 17a. Further, upper sleeve 14 and lower sleeve 15 extend substantially parallel to the exit portion of the pipe 13. It is these upper and lower sleeves 14 and 15 that minimize the Coandă effect, thereby directing exhaust gas 26 and exhaust condensate 28 away from the fascia 4, upper bezel 7 and lower bezel 8.

According to another embodiment, the exhaust assembly 10 can be configured such that exhaust opening 17 includes an exhaust opening plane 20 (see FIG. 2). Exhaust opening plane 20 can be arranged and defined such that it is tangent to the rearmost surfaces 7b and 8b of the upper and lower bezels 7 and 8. It is also conceivable that opening plane 20 is configured tangent to other, rearmost exterior surfaces of the vehicle, including rearmost surfaces of the fascia 4, for example (not shown). The upper sleeve 14 and lower sleeve 15 can thus extend rearward to at least the exhaust opening plane 20 as further shown in FIG. 2. This relationship ensures that the lower and upper sleeve 14 and 15 each extend at least slightly past the rearmost surfaces 7b and 8b of the upper and lower bezels 7 and 8, respectively. Consequently, exhaust gas 26 and exhaust condensate 28 are directed away from these surfaces by the sleeves 14 and 15, thus minimizing the Coandă effect and mitigating unwanted soot deposition.

As also shown in FIG. 2, exhaust assembly 10 can also be configured such that the upper and lower sleeves 14 and 15 extend substantially parallel to the exit portion of the exhaust pipe 13 and tangentially to the upper and lower bezels 7 and 8. In particular, upper bezel 7 and lower bezel 8 may each comprise inner surfaces 7a and 8a, respectively. These surfaces 7a and 8a are arranged substantially parallel to the exit portion of the exhaust pipe 13. Thus, the upper and lower sleeves 14 and 15 are arranged tangentially to these surfaces 7a and 8a. With this particular configuration of exhaust assembly 10, the sleeves 14 and 15 are configured to maximize a straight exit path for exhaust gas 26 and condensate 28, emanating from pipe 12. The net effect is a further reduction in the Coandă effect, thereby reducing soot accumulation on the fascia 4 and bezel 6 surfaces.

Exhaust assembly 10 may also be particularly configured to minimize the effects of soot deposition from condensate 28 on the exterior surfaces of the vehicle 1, e.g., fascia 4 and bezel 6. As shown in FIG. 2, exhaust assembly 10 can be configured such that its upper portions, e.g., upper sleeve 14 and/or upper bezel 7, are located rearward relative to its lower portions, e.g., lower sleeve 15 and/or lower bezel 8. That is, the upper sleeve 15 can be positioned such that its rearmost edge is rearward of the rearmost edge of lower sleeve 14. This positional relationship has the effect of increasing the distance between condensate 28 emanating from the exit opening 17 and rear surfaces of the vehicle, e.g., rear surfaces of the fascia 4, lower than assembly 10. This is because condensate 28 is generally heavier than air and tends to drop toward the ground by gravity during operation of the vehicle 1 (see FIG. 1) under typical engine running speeds and condensate flow velocities.

In another embodiment, exhaust assembly 10 may also be particularly configured to minimize Coandă effects through positional control of the upper sleeve 14 relative to the upper bezel 7. In certain vehicle configurations and at certain vehicle velocities, the upper bezel 7 and upper elements of fascia 4 (not shown) are particularly prone to Coandă effects as they may have significantly more surface area than comparable lower bezel 8 and lower elements of fascia 4, respectively. As shown in FIG. 2, an upper sleeve tangent line 21 can be configured such that it is drawn tangent to the rearmost surfaces 7b of upper bezel 7 and perpendicular to upper sleeve 14. Upper sleeve 14 can then be configured such that it extends rearward to at least tangent line 21. By utilizing this arrangement with tangent line 21, exhaust assembly 10 can ensure that upper sleeve 14 is provided with sufficient clearance from upper bezel 7 and upper elements (not shown) of fascia 4.

The foregoing configurations of exhaust assembly 10 that depend on exhaust plane 20 and/or tangent line 21 are used to ensure the rearward positional location of sleeve 16, upper sleeve 14 and/or lower sleeve 15 relative to the rearmost curved surfaces of the vehicle 1 (e.g., fascia 4, rearmost surfaces 7b and 8b of bezel 6, etc.). As such, assembly 10 should be configured to ensure that the sleeve 16 (see FIGS. 1 and 1A) can direct and/or shear the exhaust gas 26 and exhaust condensate 28 away from these surfaces to minimize Coandă effects. It should also be understood that other relationships between the sleeve 16 and rear components of vehicle 1 similar to those described in connection with exhaust plane 20 and tangent line 21 can be employed with the same or similar results.

The various components associated with exhaust assembly 10 can be fabricated from materials as understood in the art. For example, exhaust pipe 12 can be made from various steel alloys with sufficient corrosion resistance and mechanical properties for the application. The fascia 4, bezel 6 and sleeve 16 can also be made from polymers, metals and composites suitable for their intended application. The interior surfaces of sleeve 16 can be configured with high smoothness and uniformity to improve exhaust gas 26 and condensate flow 28 through opening 17 thereby minimizing the deposition of soot on the surfaces of the sleeve 16.

Figure 1A:
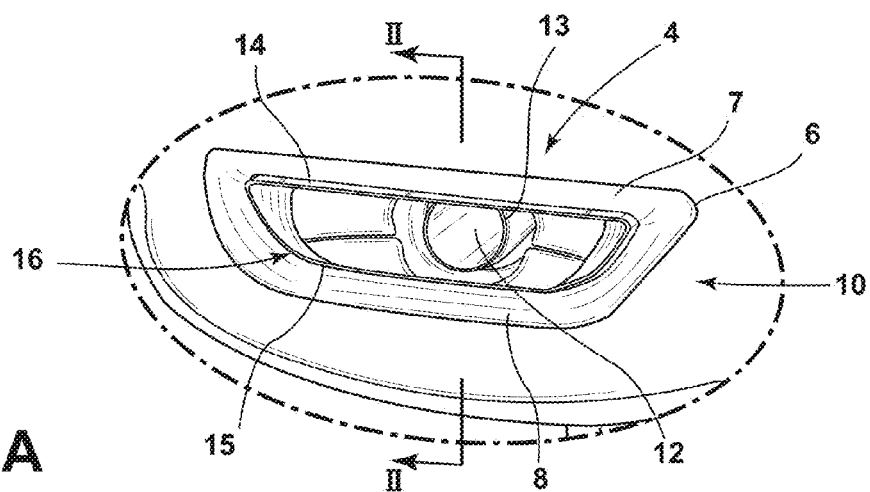
FIG. 1A is an enlarged view of the exhaust assembly depicted in FIG. 1.
Figure 1B:
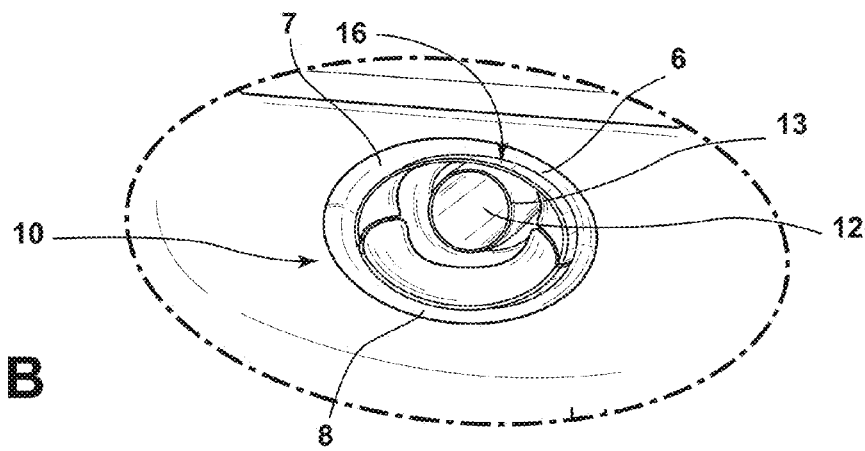
FIG. 1B is an enlarged view of an exhaust assembly with a circularly shaped bezel and sleeve installed in the vehicle depicted in FIG. 1 according to another embodiment.

As shown in FIGS. 1A & 1B, exhaust assembly 10 can be arranged such that sleeve 16, and/or upper and lower sleeve portions 14 and 15 take on substantially trapezoidal (FIG. 1A), substantially cylindrical (FIG. 1B) or other shapes. There are numerous possible shapes of sleeve 16 that can be created to match particular designs associated with fascia 4, bezel 6, upper bezel 7 and/or lower bezel 8. It can be beneficial to ensure that the foregoing relationships between the sleeve 16 and the bezel 6, upper bezel 7, lower bezel 8 and/or fascia 4 are maintained along a substantial portion of the periphery of these elements. As such, the sleeve 16, upper and lower sleeve portions 14 and 15 are preferably continuous within the fascia 4 and bezel 6 elements as shown in FIGS. 1A and 1B. Sleeve 16, and/or upper sleeve 14 and lower sleeve 15, are also preferably configured in a continuous shape within exhaust opening 17 (see FIGS. 1A, 1B and 2).

Figure 3:
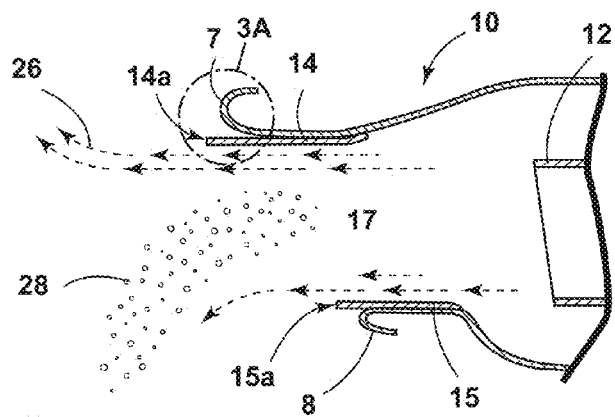
FIG. 3 is a cross-sectional view of an exhaust assembly with a straight-edged sleeve according to a further embodiment.
Figure 3A:
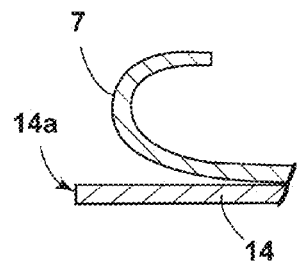
FIG. 3A is an enlarged view of the sleeve and bezel regions of the exhaust assembly depicted in FIG. 3.
Figure 4:
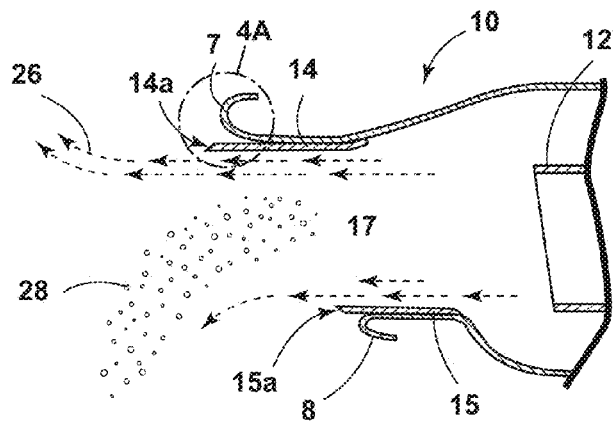
FIG. 4 is a cross-sectional view of an exhaust assembly with a tapered-edged sleeve according to an additional embodiment.
Figure 4A:
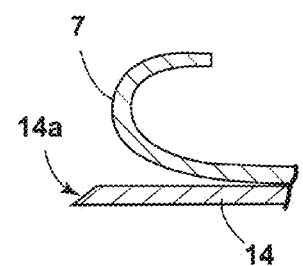
FIG. 4A is an enlarged view of the sleeve and bezel regions of the exhaust assembly depicted in FIG. 4.
Figure 5:
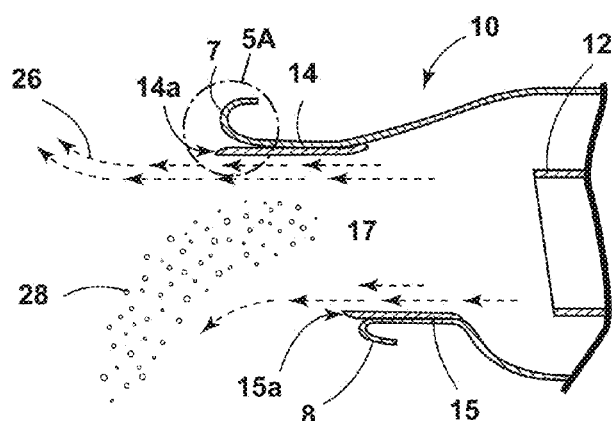
FIG. 5 is a cross-sectional view of an exhaust assembly with a sleeve having an edge rounded to a point according to another embodiment.
Figure 5A:
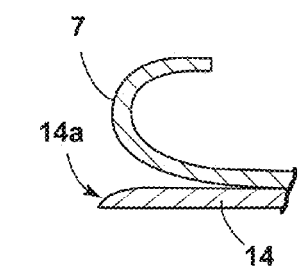
FIG. 5A is an enlarged view of the sleeve and bezel regions of the exhaust assembly depicted in FIG. 5.

As shown in FIGS. 3-5A, the Coandă effect reductions associated with exhaust assembly 10 can also be improved by the control of the shape of the edges 14a and 15a of the rearmost portion of the upper and lower sleeve portions 14 and 15, respectively. In FIGS. 3 and 3A, the edges 14a and 15a are characterized by straight edges substantially perpendicular to the flow of exhaust gas 26 and exhaust condensate 28. In FIGS. 4 and 4A, edges 14a and 15a possess a tapered edge toward the upper bezel 7 and lower bezel 8, away from the flow of exhaust gas 26 and exhaust condensate 28. As such, edges 14a and 15a shown in FIGS. 4 and 4A are substantially tapered to a point. Referring to FIGS. 5 and 5A, the edges 14a and 15a are curved to a point, away from the flow of gas 26 and condensate 28. Each of these configurations tend to improve the flow of gas 26 and condensate 28 from pipe 12 through opening 17 such that the flow stream moves away from exterior surfaces of the vehicle 1 (see FIG. 1), such as upper bezel 7 and lower bezel 8 (see FIGS. 3-5). Other shapes of edges 14a and 15a are feasible, provided that they are characterized by a discontinuous edge feature, preferably a sharp edge or edges, in the rearward direction.

It should also be apparent that manufacturing limitations and/or handling-related concerns can dictate the need to impart some slight roundness and/or additional facets to edges 14a and 15a. It is also possible to taper or curve edges 14a and 15a toward the flow of gas 26 and exhaust condensate 28 (not shown). Such a configuration will significantly improve the flow of gas 26 and condensate 28 away from the exterior surfaces of vehicle 1, but is less preferred than the configurations depicted in FIGS. 3-5A.

Figure 6:
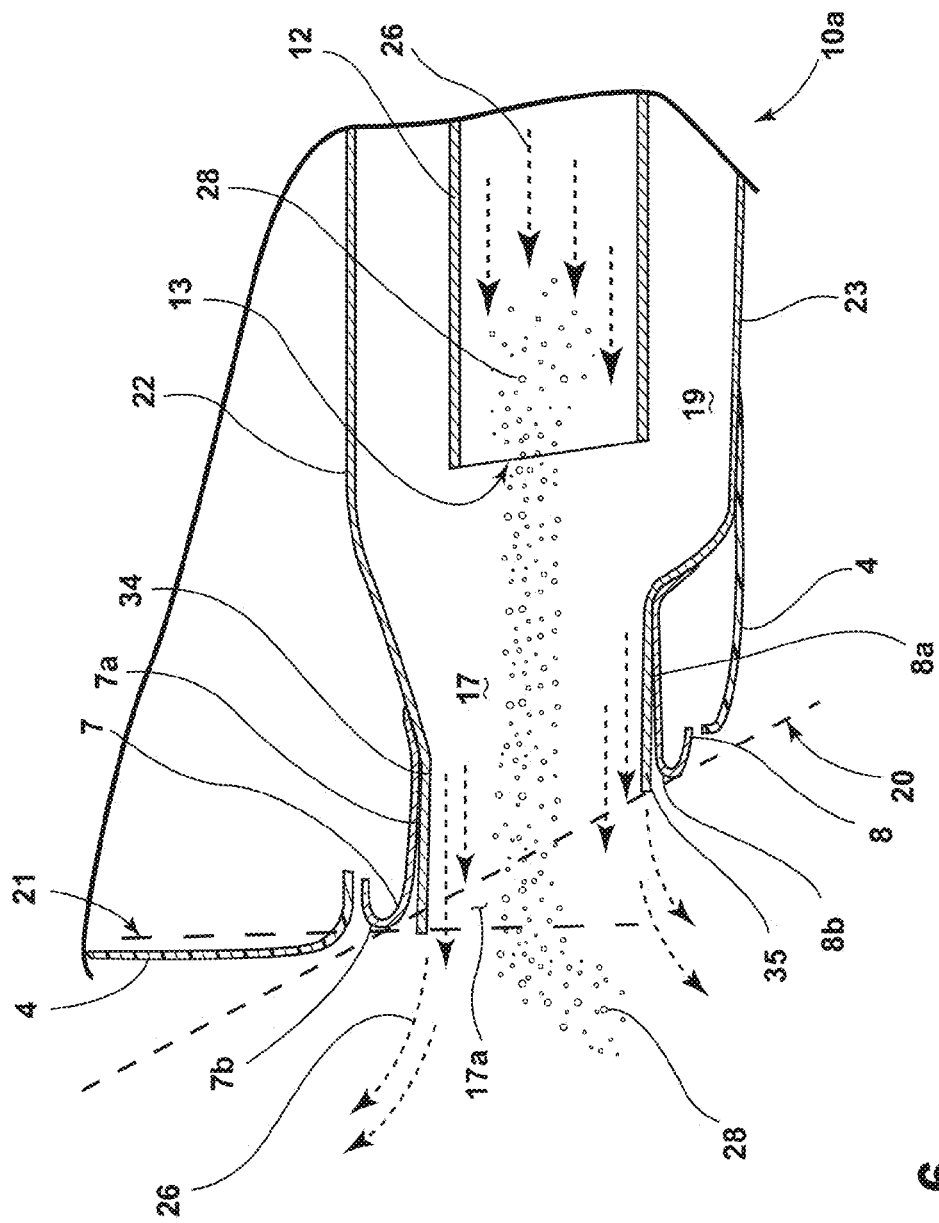
FIG. 6 is a cross-sectional view of an exhaust assembly an integrated sleeve and heat shield according to a further embodiment.

As shown in FIG. 6, exhaust assembly 10a may be configured such that it possesses a sleeve 16 (see, e.g., FIG. 1) integral with the upper and lower heat shield 22 and 23. Exhaust assembly 10a includes an integrated upper sleeve 34 that is integral with upper heat shield 22. Similarly, integrated lower sleeve 35 is integral with lower heat shield 23. The upper and lower bezels 7 and 8 are then coupled or otherwise attached to the upper and lower integrated heat shield elements 34 and 35. Compared to the exhaust assembly 10 depicted in FIG. 2, the exhaust assembly 10a depicted in FIG. 6 can be simpler to manufacture as the sleeve is integral with the heat shield. It also has the benefit of providing a smooth set of inner surfaces defining exhaust passage 19, assisting in the movement of gas 26 and condensate 28 through opening 17. In all other respects, the exhaust assembly 10a is configured comparably to exhaust assembly 10.

Figure 7:
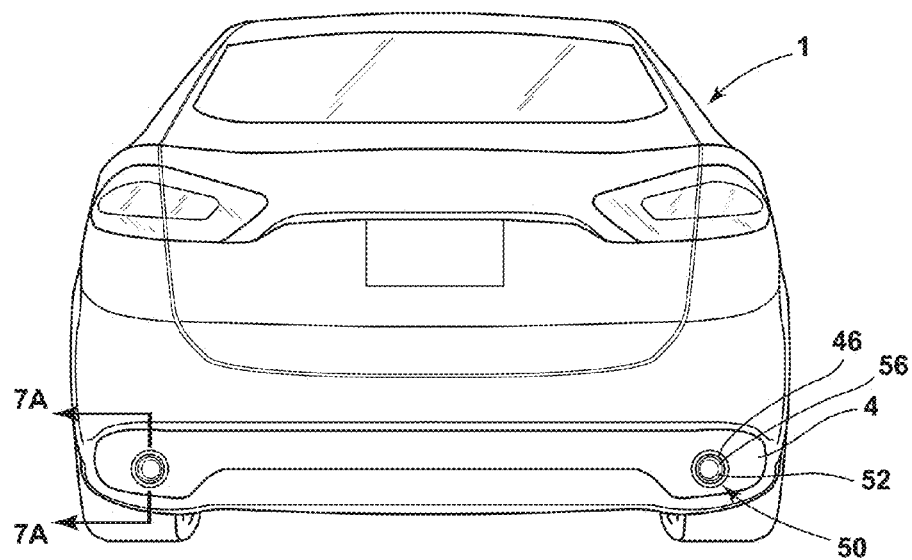
FIG. 7 is a rear, perspective view of a vehicle with a decorative exhaust tip assembly according to an additional embodiment.
Figure 7A:
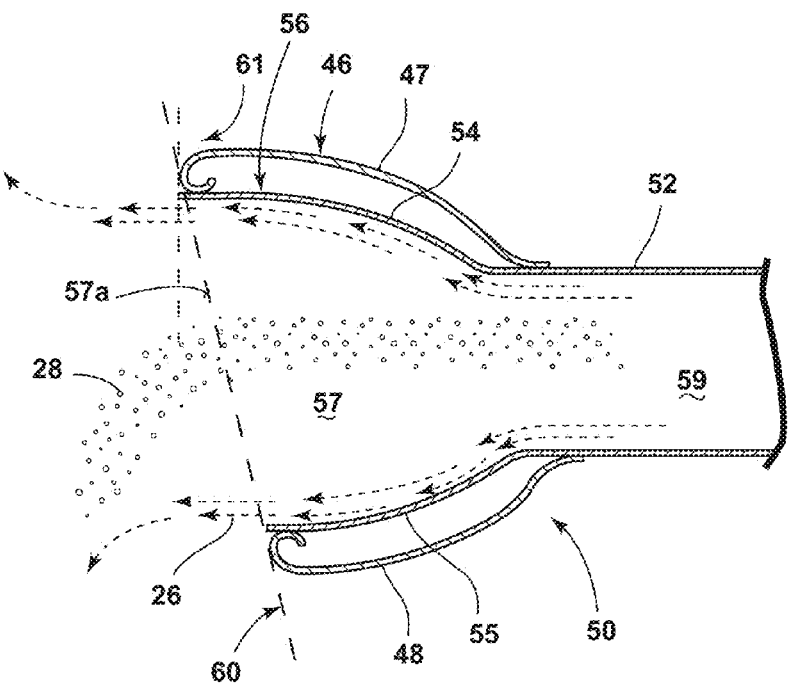
FIG. 7A is a cross-sectional view of the decorative exhaust tip assembly depicted in FIG. 7.

As shown in FIGS. 7 and 7A, the foregoing principles and aspects can be applied to an exhaust tip assembly 50 configured within the fascia 4 of vehicle 1 (see FIG. 1). Here, the exhaust tip assembly 50 includes an exhaust pipe 52 extending in a rearward direction from vehicle 1. The exhaust tip assembly 50 also includes a decorative exhaust tip 46 with upper tip 47 and lower tip 48 portions, and a sleeve 56 having upper and lower sleeve elements 54 and 55. The upper and lower exhaust tip portions 47 and 48 can be characterized by curved rearmost surfaces.

Adjacent and coupled to tip portions 47 and 48 are upper and lower sleeve elements 54 and 55, integral with the exhaust pipe 52, as shown in FIGS. 7 and 7A. Sleeve elements 54 and 55 extend rearward and their rearmost portions are substantially parallel to the walls of exhaust pipe 52. Together, upper and lower sleeve elements 54 and 55, along with pipe 52, define an exhaust opening 57. Further, the rearmost portion 57a of the exhaust opening 57 is defined by the rearmost surfaces of tips 47 and 48. Accordingly, upper and lower sleeve elements 54 and 55 extend at least to the rearmost portion 57a of the exhaust opening 57 as shown in FIG. 7A. This ensures that the sleeve elements 54 and 55 can cooperate in directing exhaust gas 26 and condensate 28 away from the rearmost surfaces of decorative exhaust tip 46, thus mitigating Coandă effects.

Exhaust tip assembly 50 may also be configured such that upper and lower sleeve elements 54 and 55 extend rearward at least to exhaust opening plane 60 and/or upper sleeve tangent line 61. Exhaust opening plane 60 is defined by a plane tangent to the rearmost surfaces of upper and lower tip portions 47 and 48. Upper sleeve tangent line 61 is defined as the line or lines tangent to the upper tip portion 47 and perpendicular to the rearmost edges of upper sleeve element 54. As such, exhaust tip assembly 50 relies on sleeve elements 54 and 55 in a similar fashion as exhaust assemblies 10 and 10a rely on sleeve 16.

It should thus be understood that exhaust assemblies 10, 10a and 50 are exemplary of the systems that can be used to mitigate or eliminate Coandă effects related to soot accumulation on the exterior surfaces of vehicles. Other configurations are possible, depending on the arrangement of the exhaust pipe 12 relative to the rear, exterior components of vehicle 1.

Figure 8:
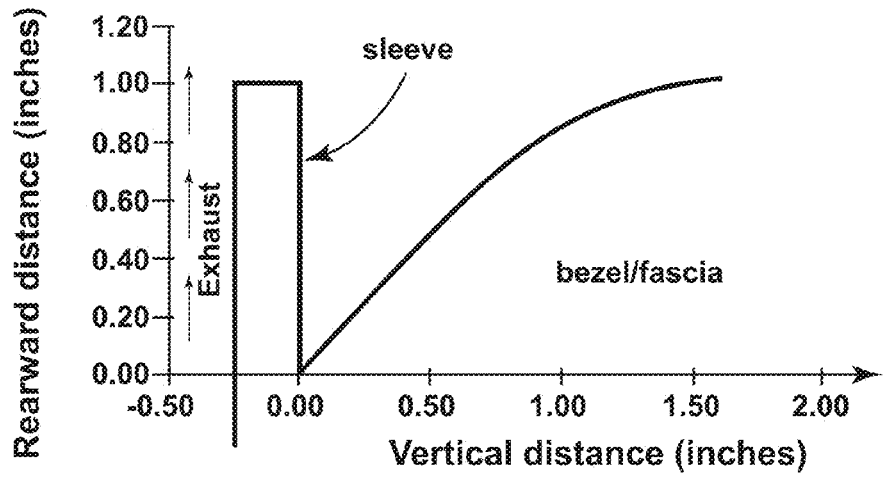
FIG. 8 is a cross-sectional schematic of the contour of a sleeve and bezel/fascia in the rearward and vertical directions according to a further embodiment.
Figure 8A:
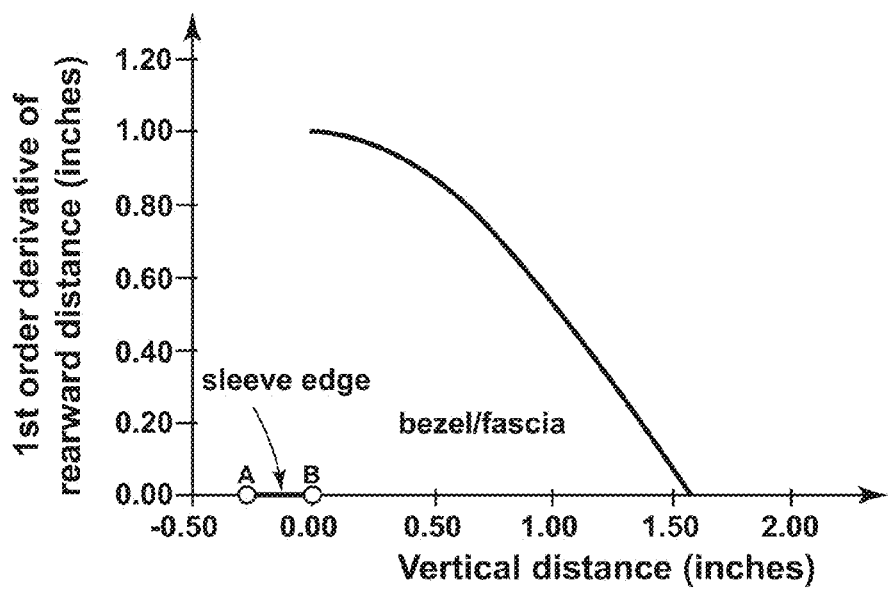
FIG. 8A is a schematic of the first order derivative of the contour the sleeve and bezel/fascia depicted in FIG. 8.

Further, other relationships may be used to configure and position the sleeves 16, 56 or the like within such exhaust assemblies used in vehicles. As depicted in FIGS. 8 and 8A, for example, a sharp edge feature can be ensured on the rearmost portion of sleeves 16, 56 or the like by the employment of particular mathematical relationships. FIG. 8 schematically depicts the contour of a sleeve (e.g., sleeve 16, 56) and bezel (e.g., bezel 6)/fascia (e.g., fascia 4) in the rearward and vertical directions according to a further embodiment. The rearmost edge of the sleeve is characterized by a straight edge comparable to the edges 14a and 15a depicted in FIGS. 3 and 3A. The cross-sectional outline of the sleeve and bezel interacts with the exhaust gas flow stream as shown in FIG. 8. In FIG. 8, the y-axis corresponds to the rearward direction and the x-axis corresponds to the vertical direction relative to the ground. The first order derivatives (dy/dx) of these features are depicted in FIG. 8A. In the interval between Point A and Point B, the cross-sectional outline of the sleeve (e.g., sleeve 16, 56; see FIG. 8) is differentiable and its first order derivative is zero. However, the first order derivative at Point A, and at Point B, approaches infinity (i.e., the rearward distance increases while the vertical distance is unchanged), as denoted in FIG. 8A by the closed-circle symbols beneath Points A and B. A first order derivative that approaches infinity can demonstrate the presence of a discontinuous edge feature associated with a sleeve 16, 56, a characteristic that is particularly beneficial in reducing or eliminating Coandă effects associated with the flow of exhaust gas 26 and condensate 28.

Figure 9:
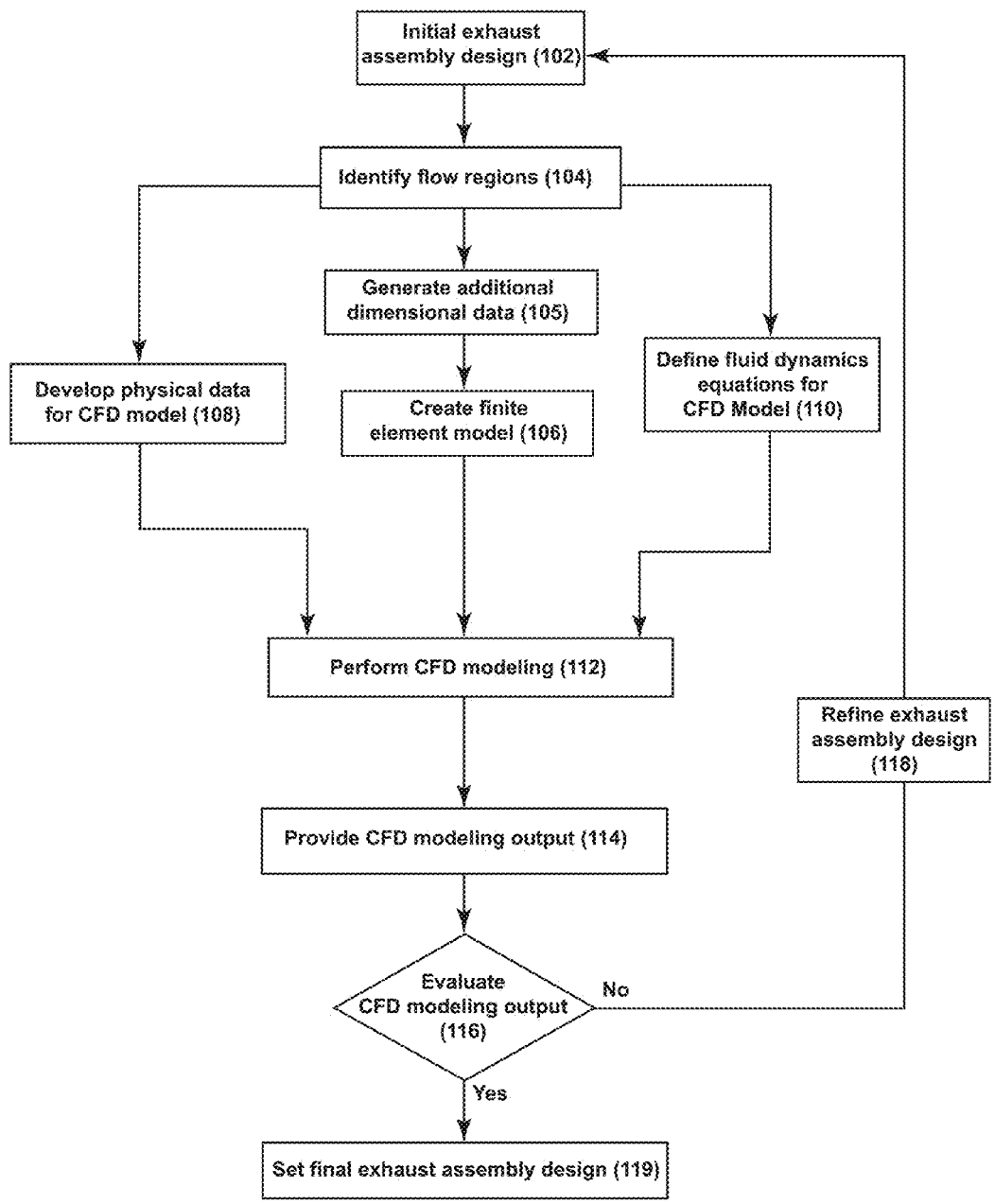
FIG. 9 is a flow chart schematic depicting a conventional exhaust assembly design model.

Referring to FIG. 9, a conventional method 120 of designing an exhaust assembly is depicted. In step 102, the initial data inputs for a computer aided design (CAD) of the exhaust assembly is developed. This step is particularly time consuming as the exterior surfaces of the exhaust assembly are developed in the first instance without the benefit of any exhaust flow-related modeling. At step 104, flow regions are identified that will be modeled in later steps using computational fluid dynamics (CFD) simulations. Based on the assessment in step 104, step 108 is conducted to develop physical data (e.g., mass flow rate, vehicle velocity, etc.) for the CFD model. Similarly, step 110 is also conducted based on the assessment in step 104 to define the appropriate fluid dynamics equations (e.g., a "wall function" as understood by those with ordinary skill in the field) to employ in the CFD model. Further, step 105 is also conducted based on the results of the assessment in step 104. Step 105 involves generating additional dimensional data for the flow regions identified in step 104. In step 106, a finite element model is created using the data from step 105 using conventional (and often time-consuming) meshing approaches. In step 112, a CFD modeling is performed on the model generated in step 106 and the data inputs from steps 108 and 110. At step 114, the computer handling the CFD modeling provides various output to aid in the development of the exhaust assembly design, including exhaust pressure distributions, exhaust velocity distributions, and exhaust flow profiles.

At step 116 of the conventional exhaust assembly design method 120 depicted in FIG. 9, the results from step 114 are evaluated in view of various engineering requirements. When more development is needed, as is often the case, the answer at step 116 is "No," further refinements to the design are made at step 118, and the method involves returning to step 102. Indeed, many iterations back to step 102 are usually needed because the initial exhaust assembly designs are not created with the benefit of exhaust flow modeling. Upon each design cycle, additional models are created at step 118 and then run again in steps 102 through 116 of the conventional method 120 using CFD simulations. The process is particularly time-consuming in that very detailed models are created at steps 105 and 106. Even the computer time at step 112 is significant insofar as the models simulated by the computer are complex. Once an answer of "Yes" is obtained at step 116 that the design has satisfied all applicable engineering requirements, the method 120 moves to step 119. At step 119, the final exhaust assembly design is set, possibly with further adjustments for manufacturing reasons.

Figure 10:
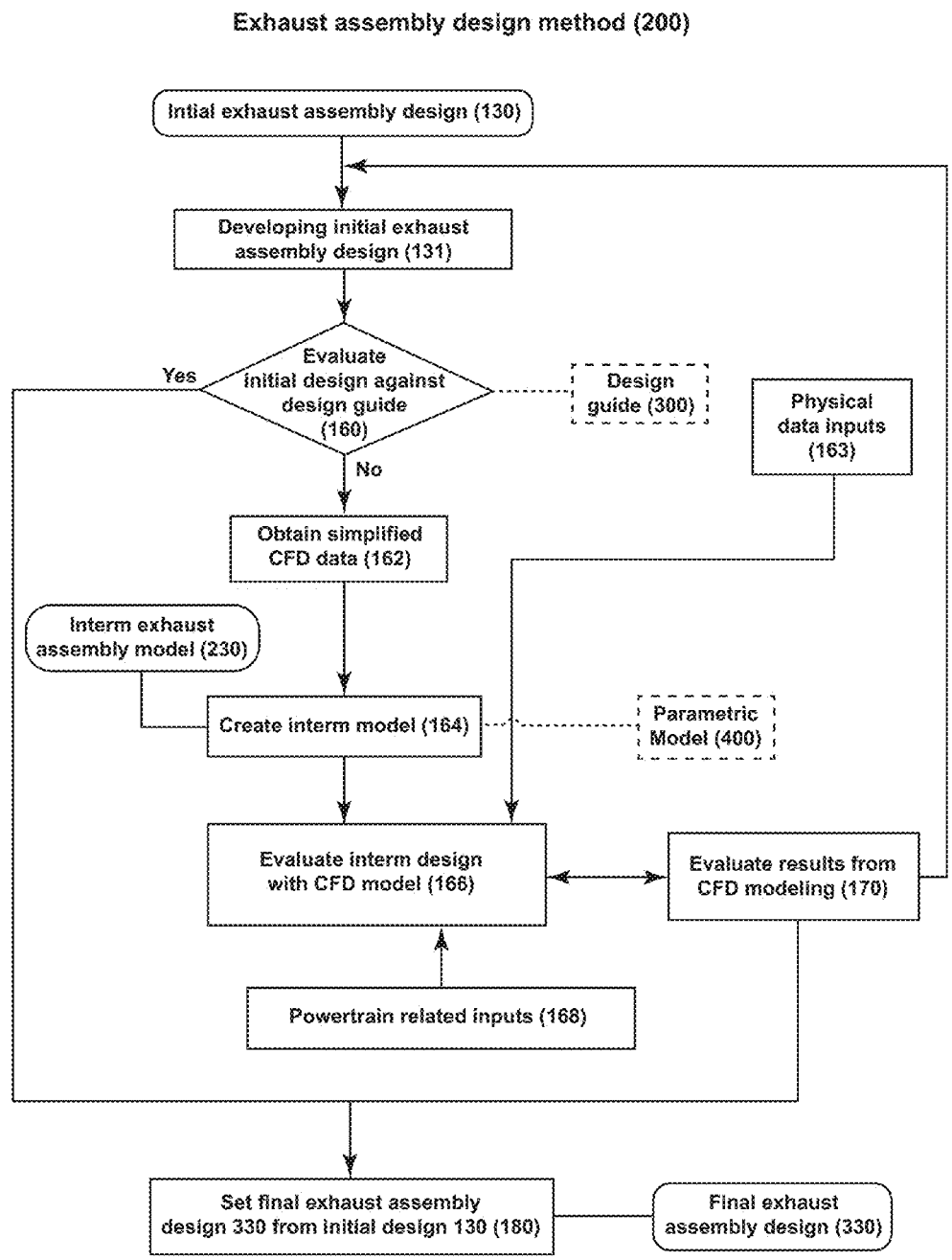
FIG. 10 is a flow chart schematic of a method of designing an exhaust assembly according to an additional embodiment.

According to a further exemplary embodiment, FIG. 10 depicts a design method 200 for an exhaust assembly. Advantageously, the method 200 builds on the foregoing exhaust assembly design principles, including the design rules and considerations associated with mitigating Coandă-related soot accumulation effects. For example, exhaust assemblies consistent with the exhaust assemblies 10, 10a and 50 (see, e.g., FIGS. 1A, 1B, 2, 6 and 7A) can be developed using method 200. Further, employment of method 200 to design an exhaust assembly is significantly less time-consuming than the conventional method 120 depicted in FIG. 9.

Referring to FIG. 10, the design method 200 begins with step 131, developing an initial exhaust assembly design 130. In some embodiments, initial exhaust assembly design 130 is a two-dimensional rough outline of an exhaust assembly (see FIGS. 11A-11C). As shown in FIG. 10, design method 200 moves to step 160 after the initial design 130 has been developed at step 131. At step 160, the initial design 130 is evaluated against a design guide 300. In particular, the various parameters and features of the initial design 130 (see FIGS. 11A-11C) are compared against particular exhaust assembly design rules established in the design guide 300. Table 1, discussed in greater detail below, outlines various rules that can be delineated in design guide 300 according to some exemplary embodiments of the design method 200. The design guide 300 may also establish engineering considerations and design rules for the final, desired exhaust assembly based prototype build and the foregoing principles, including the mitigation of Coandă-related soot accumulation effects.

Referring again to FIG. 10, the design method 200 can save considerable exhaust assembly design time at step 160. If the initial exhaust assembly design 130 satisfies the considerations built into step 160, e.g., the design rules and engineering considerations built into design guide 300, method 200 moves to step 180. At step 180, the initial exhaust assembly design 130 becomes a final exhaust assembly design 330. Essentially, the knowledge from prior exhaust assembly designs, experiments and prototypes are built into the design guide 300. By applying those teachings against the initial design 130, considerable time savings can be achieved in the overall design cycle for the final exhaust assembly design 330.

At step 160, as depicted in FIG. 10, if the initial exhaust assembly design 130 does not satisfy the considerations built into step 160 (e.g., the initial design 130 does not satisfy the design guide 300), method 200 moves to step 162. At step 162, simplified CAD data is obtained from the initial design 130. At step 164, the simplified CAD data from the initial exhaust assembly design 130 is used to create an interim exhaust assembly model 230. In particular, a parametric model 400 is employed at step 164 to assist in the creation of the interim exhaust assembly model 230 (see, e.g., FIGS. 12A-12C). The parametric model 400 includes various equations that have been abstracted into a design tool within a computer. In particular, the equations mathematically represent various surfaces in the interim exhaust assembly 230 that can be created and adjusted within the parametric model 400 (see, e.g., bezel shield transition surfaces 251-254 depicted in FIGS. 12A-12C). As a consequence, the interim exhaust assembly 230 is based on both the initial exhaust assembly design 130 and the parametric model 400. In some embodiments, the same exhaust assembly design considerations built into the design guide 300 are also employed in the parametric model 400.

Referring again to FIG. 10, at step 166 of the exhaust assembly design method 200, the interim exhaust assembly design 230 is evaluated using a CFD model. As shown in FIG. 10, the CFD model employed at step 166 also relies on inputs provided in steps 163 and 168. In step 163, various physical data is provided as inputs for the CFD modeling conducted in step 166 (e.g., mass flow rate, vehicle velocity, etc.). In step 168, adjustments are provided as inputs for the CFD modeling in step 166 based on data associated with the powertrain for the particular vehicle in the design phase. For example, engine-related development issues may include combustion-related problems. Rather than waiting for these issues to be resolved, it is possible in step 168 to account for them and make adjustments to the CFD model in step 166 such that the exhaust assembly design work can continue.

At step 170 in the design method 200, the results from the CFD analysis in step 166 associated with the interim exhaust assembly design 230 are evaluated. For example, an evaluation can be conducted to ensure that the exhaust velocity that exits the exhaust assembly for various combustion conditions does not exceed a threshold indicative of high levels of vehicle noise and vibration. In some embodiments, this threshold is set at an exhaust flow rate of less than or equal to 40 m/s. It is also possible to check the exhaust flow path exiting the exhaust assembly to ensure that Coandă-related soot accumulation effects are mitigated by the interim exhaust assembly design 230. Based upon the evaluation conducted at step 170, further optimization of the interim exhaust assembly design 230 may be necessary. In that case, the design method 200 begins again at step 131 after some adjustments are made to the interim design 230. In this fashion, additional interim designs 230 are created through the operation of steps 131, 160, 162, 164 and 166 until a satisfactory evaluation is obtained at step 170.

On the other hand, if the evaluation of interim design 230 at step 170 is satisfactory, the interim exhaust assembly design 230 is converted to a final exhaust assembly design 330 at step 180. At step 180, the simplified representation of the exhaust assembly in the form of interim design 230 can be meshed and developed with greater detail using CAD techniques. In doing so, the mathematical relationships used to create interim design 230 will no longer govern. Once this work is completed at step 180, the final exhaust assembly design 330 can be assessed in the context of prototyping and manufacturing development.

The design method 200 depicted in FIG. 10 offers some significant advantages over conventional approaches to exhaust assembly design (e.g., method 120 shown in FIG. 9). For instance, it is possible to arrive at a final exhaust assembly design 330 after conducting only a few steps—e.g., steps 131, 160 and 180. In particular, if a two-dimensional, simplified initial exhaust assembly design 130 satisfies the design guide 300, no CFD modeling is necessary in the design method 200. This saves a considerable amount of design time and cost. In other cases, the interim exhaust assembly designs 230 will require CFD modeling in the design method 200. But, again, the design method 200 offers some significant design and engineering time savings. This is because the interim exhaust assembly design 230 that is modeled using CFD approaches at step 166 is a relatively simple three-dimensional model, possessing surfaces governed by various mathematical relationships. As such, the time-consuming efforts necessary to build and mesh a more detailed model (see, e.g., steps 102-106 in the model 120 depicted in FIG. 9) are not necessary in design method 200.

Figure 11A:
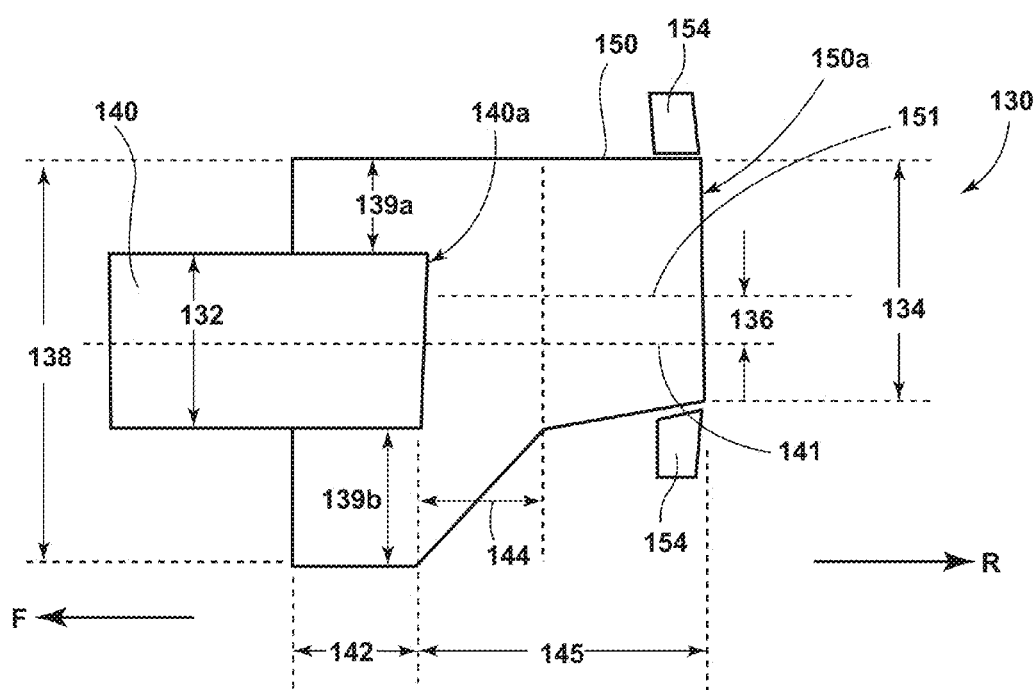
FIG. 11A is a cross-sectional side view of an initial exhaust assembly design dimensioned with a design guide according to a further embodiment.

Referring to FIG. 11A, a cross-sectional side view of an initial exhaust assembly design 130 is depicted according to another embodiment. The directions "F" and "R" in FIG. 11A correspond to the forward and rearward directions, respectively, for the initial exhaust assembly design 130 associated with a vehicle (not shown). As shown, initial design 130 comprises an exhaust pipe 140 having an exhaust pipe opening 140a and exhaust pipe centerline 141. Further, the opening 140a possesses an exhaust pipe height 132. The initial design 130 also comprises a bezel shield 150 that defines a shield exhaust opening 150a substantially aligned with the exhaust pipe opening 140a, a bezel shield centerline 151. For example, the distance 136 between the centerlines exhaust pipe centerline 141 and the bezel shield centerline 151 is minimized in some embodiments to ensure substantial alignment between the exhaust pipe opening 140a and the bezel shield opening 150a. Further, the shield exhaust opening 150a possesses a shield exhaust height 134. In addition, the bezel shield 150 also comprises a forward shield opening height 138. In some embodiments, the initial exhaust assembly design 130 may further comprise a bezel 154 in proximity or otherwise connected to the bezel shield 150. In some embodiments, the leading outer edges of shield exhaust opening 150a are oriented substantially parallel to the primary axis of the exhaust pipe 140 and opening 140a to mitigate Coandă-related soot accumulation effects.

Still referring to FIG. 11A, the exhaust pipe 140 of the initial exhaust assembly design 130 can be configured relative to the bezel shield 150 such that it possesses an upper clearance 139a and a lower clearance 139b. Further, the exhaust pipe 140 and bezel shield 150 can overlap each other in the forward direction "F" such that they possess an overlap dimension 142, as shown in FIG. 11A. In addition, the rearward distance 145 is defined between the exhaust pipe opening 140a and the shield exhaust opening 150a in the rearward direction, "R". Further, a minimum clearance 144 is defined between the exhaust pipe opening 140a and the closest interior point of the bezel shield 150 relative to the exhaust pipe 140.

Figure 11B:
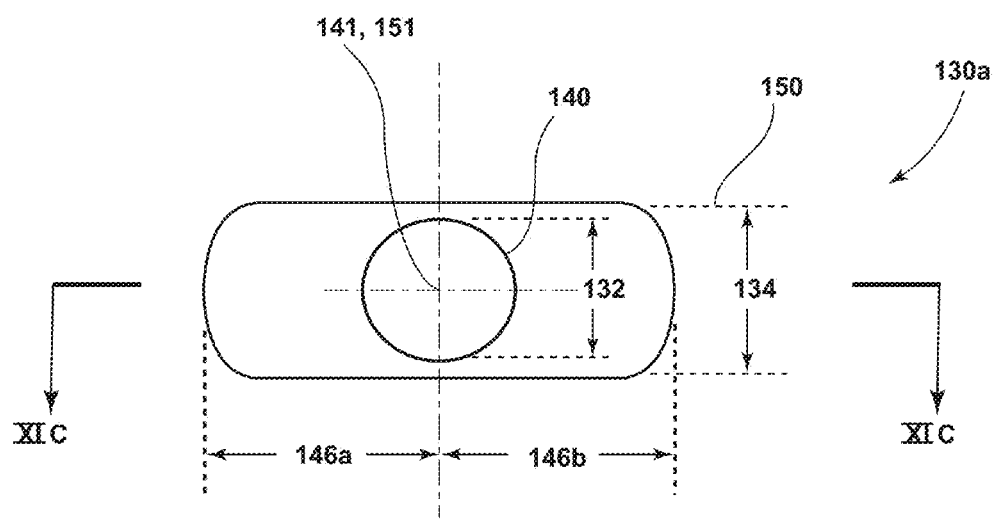
FIG. 11B is a cross-sectional rear view of the initial exhaust assembly design depicted in FIG. 11A.

Turning to FIG. 11B, a cross-sectional rear view of another embodiment of an initial exhaust assembly design 130a is depicted. The initial exhaust assembly designs 130 (see FIG. 11A) and 130a are substantially identical, with commonly-identified elements. However, in the design 130a shown in FIG. 11B, the centerlines 141 and 151 of the exhaust pipe 140 and bezel shield 150, respectively, are in complete alignment. Further, FIG. 11B demonstrates the lateral relationship between the exhaust pipe 140 and the bezel shield 150. In particular, lateral distances 146a and 146b define the left and right respective lateral distance between the exhaust pipe centerline 141 and the outer surface of the bezel shield 150.

Figure 11C:
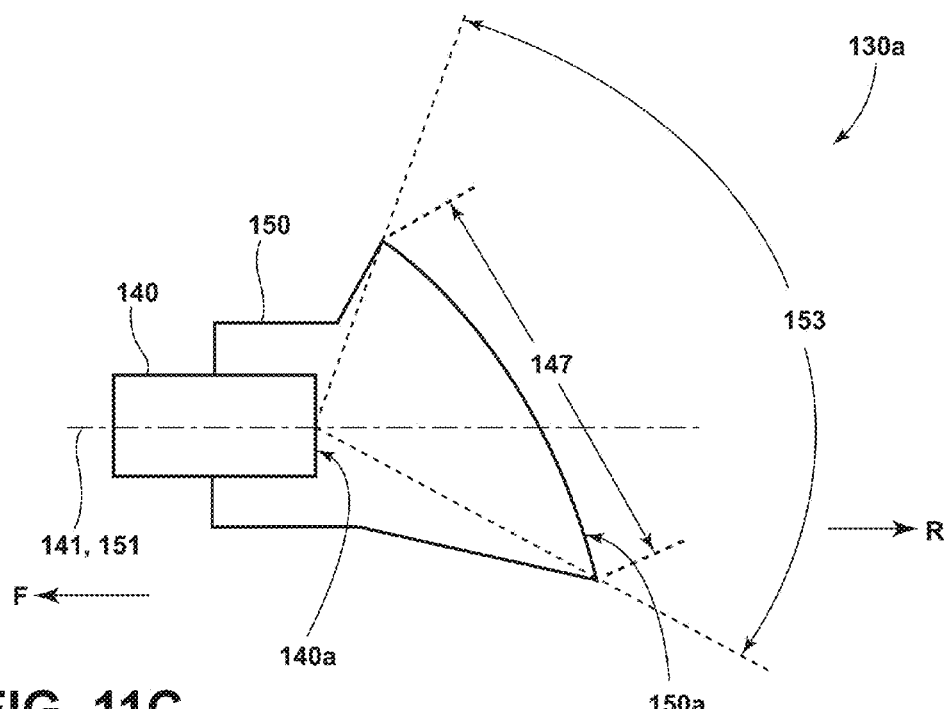
FIG. 11C is a cross-sectional plan view of the initial exhaust assembly design depicted in FIG. 11A.

In FIG. 11C, a cross-sectional plan view of the initial exhaust assembly design 130a is depicted. The shield exhaust opening 150a of the bezel shield 150 defines a maximum opening distance 147. Further, an exhaust opening angle 153 is defined by three points in space—the intersection of the exhaust pipe centerline 141 and the exhaust pipe opening 140a; and the outer edges of the shield exhaust opening 150a defined by the maximum opening distance 147.

Referring to FIGS. 11A-11C, the particular parameters of the initial exhaust assembly designs 130, 130a can be compared against design guide 300. As discussed earlier, design guide 300 can be employed in step 160 of the design method 200 shown in FIG. 10. In one embodiment, an exemplar design guide 300 is depicted below in Table 1. If all of the parameters satisfy the relationships provided in the "No CFD" column of Table 1, the initial exhaust assembly design 130 can be converted to a final exhaust assembly design 330 (see, e.g., FIG. 10, steps 160 and 180 of design method 200 and corresponding description). If some of the relationships provided in the "CFD" column of Table 1 are satisfied by the parameters in the initial exhaust assembly design 130, 130a, the initial design requires further evaluation by CFD modeling (see, e.g., FIG. 10, steps 162-168 and corresponding description), including the development of an interim exhaust assembly design 230, before arriving at a final exhaust assembly design 330. Finally, if any of the relationships identified in the "Unacceptable Design" column of Table 1 are satisfied, the initial exhaust assembly design 130, 130a is deemed unacceptable. As a consequence, a new initial exhaust assembly design will need to be developed (see, e.g., FIG. 10, step 131 and corresponding description).

TABLE 1

| Initial exhaust assembly design 130, 130a elements from design guide 300 (see FIGS. 11A-11C) | No CFD | CFD | Unacceptable Design |
|---|---|---|---|
| 132 | | Set by powertrain engineering | |
| 134 | 134 ≥ 1.2*132 | 132 < 134 ≤ 1.2*132 | 134 ≤ 132 |
| 136 | 136 = 0 | (136 + 132/2) ≤ (134/2) | (136 + 132/2) > (134/2) |
| 138 | N/A | N/A | N/A |
| 139a/139b | 139a and 139b ≥ 25 mm | N/A | 139a and 139b < 25 mm |
| 142 | 142 ≥ 22 mm | 142: 10 mm to 21.99 mm | 142 < 10 mm |
| 144 | 144 > 37.5 mm | N/A | 144 < 37.5 mm |
| 145 | 145 < 120 mm | 120 mm < 145 < 150 mm | 145 > 150 mm |
| 146a/146b | 146a = 146b | 146a > 146b or 146a > 146b | N/A |
| 153 | N/A | N/A | N/A |
| 147 | N/A | N/A | N/A |

Referring to Table 1, depicting an exemplary embodiment of a design guide 300, an initial exhaust assembly design 130, 130a can be compared against the listed design and engineering considerations provided. For instance, an initial design 130, 130a having a shield exhaust height 134 that is less than or equal to the exhaust pipe height 132 constitutes an exhaust assembly design in the "Unacceptable Design" column. As such, a new initial exhaust assembly design will need to be developed according to the design method 200, e.g., at step 131 (see FIG. 10). As another example, an initial design 130, 130a having an overlap dimension 142 of 15 mm would constitute a design in the "CFD" column. Consequently, this initial design 130, 130a will need to be evaluated using CFD modeling according to the design method 200, e.g., at steps 162-168 (see FIG. 10).

Figure 12A:
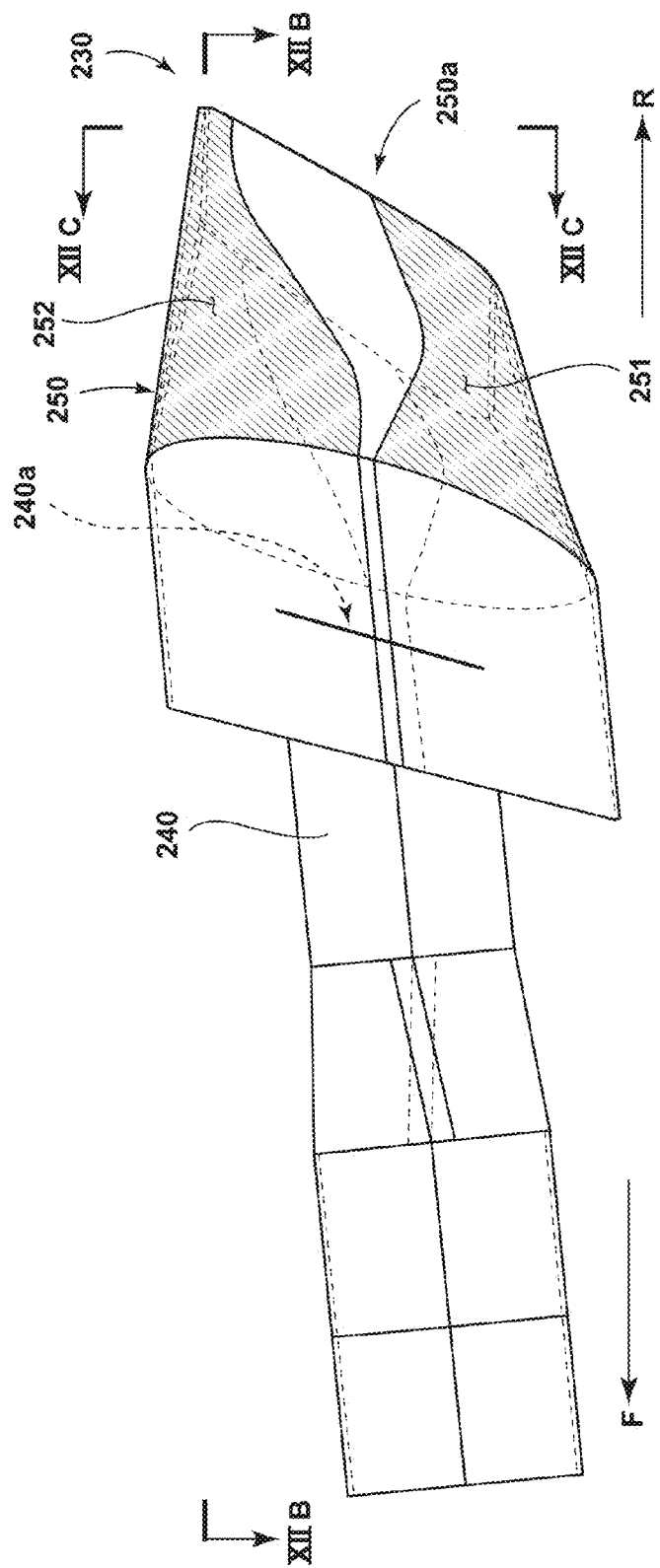
FIG. 12A is a cross-sectional side view of an interim exhaust assembly design with a bezel shield having a plurality of surfaces defined by mathematical relationships in a parametric model according to another embodiment.
Figure 12B:
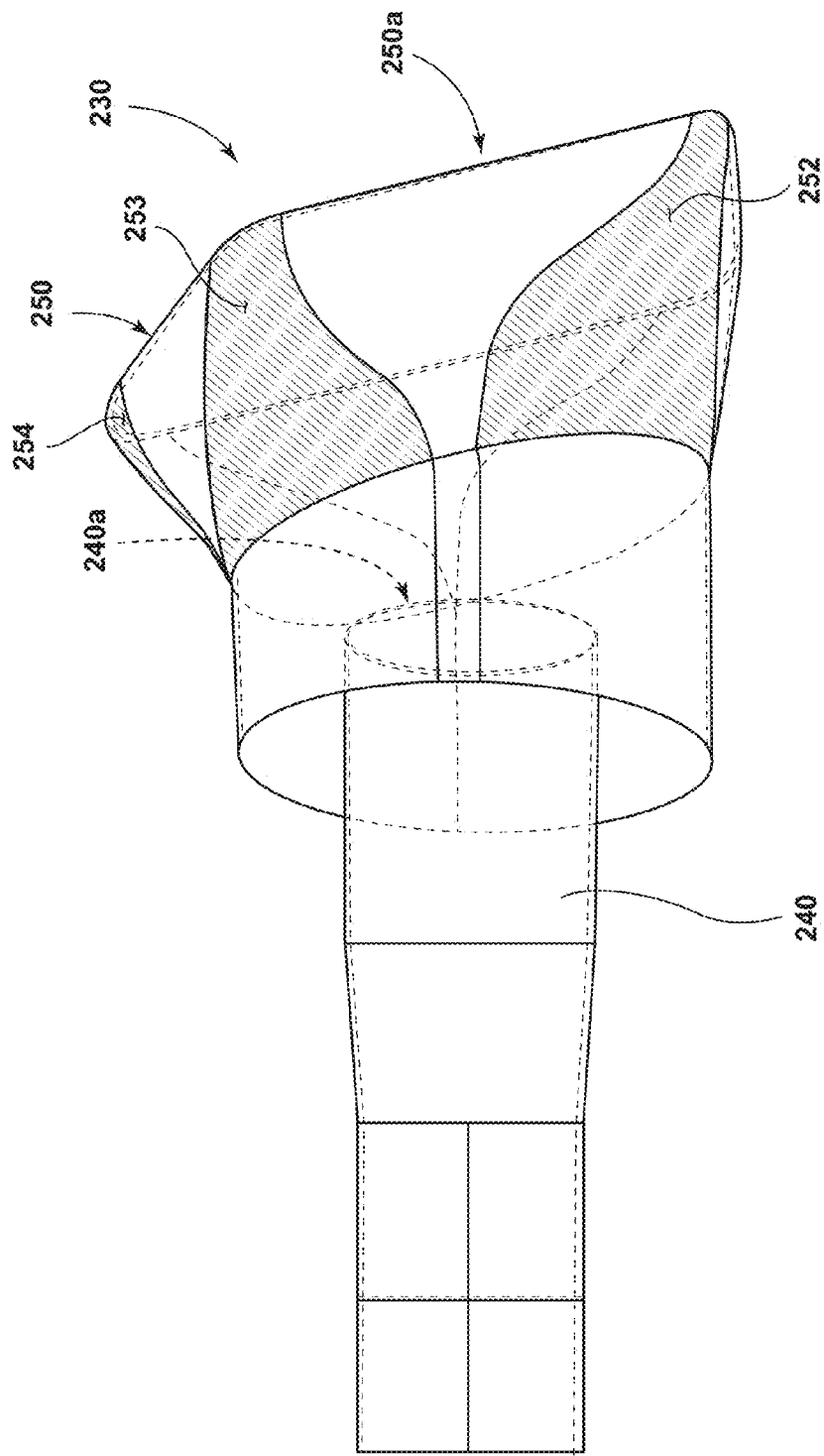
FIG. 12B is a cross-sectional plan view of the interim exhaust assembly design depicted in FIG. 12A.

Referring to FIGS. 12A-12C, an interim exhaust assembly design 230 is depicted in various perspective views according to a further embodiment. The interim design 230 is in three dimensions and comprises an exhaust pipe 240 and bezel shield 250. The exhaust pipe 240 possesses an exhaust pipe opening 240a. Similarly, the bezel shield 250 possesses a shield exhaust opening 250a. Further, the shield exhaust opening 250a is in substantial alignment with the exhaust pipe opening 240a. In some embodiments, an adjustable plane (see, e.g., exhaust opening plane 20 in FIG. 2 and corresponding description) can be defined by the shield exhaust opening 250a that can be adjusted in three dimensions to match a fascia (see, e.g., fascia 4 in FIG. 2 and corresponding description) associated with the vehicle (not shown) using the parametric model 400. In addition, the directions "F" and "R" in FIG. 12A correspond to the forward and rearward directions, respectively, for the interim exhaust assembly design 230 associated with a vehicle (not shown). In some embodiments, the leading outer edges of shield exhaust opening 250a are oriented substantially parallel to the primary axis of the exhaust pipe 240 and opening 240a to mitigate Coandă-related soot accumulation effects.

As discussed earlier, a parametric model 400 (see FIG. 10) can be used to assist in the creation of interim exhaust assembly design 230. In particular, the model 400 can be employed to create portions of the bezel shield 250 in the form of surface sections. As depicted in FIGS. 12A-12C, for example, bezel shield transition surfaces 251, 252, 253 and 254 can be created using the parametric model 400. In some embodiments of parametric model 400, cubic equations in the form of Equation (1) below can be employed to create bezel transition surfaces 251, 252, 253 and 254. As depicted below, Equation (1) can be used to produce a cross-sectional trace of surfaces 251, 252, 253 and 254 in two dimensions. Further, multiple versions of Equation (1) can be solved to develop a final equation governing the transition surfaces 251, 252, 253 and 254 in three dimensions. Once mathematical relationships are developed for the transition surfaces of bezel 250, including surfaces 251, 252, 253 and 254, these equations are coded into the parametric model residing in a computer. Three-dimensional CAD software, such as CATIA provided by Dassault Systèmes, can then be employed to refine these equations into parameter-oriented inputs that can later be entered by an exhaust assembly designer employing the parametric model 400 to develop an interim exhaust assembly design 230.

$$f(x) = a_o + a_1 x + a_2 x^2 + a_3 x^3 \quad (1)$$

where $a_o$, $a_1$, $a_2$ and $a_3$ are constants, and f(x) and x govern the transition surfaces in two dimensions.

The shape of these bezel shield surfaces 251, 252, 253 and 254, and other surface portions of the bezel shield 250, can significantly influence the exhaust flow characteristics of the interim exhaust assembly design 230 that are generated in CFD modeling (see, e.g., FIG. 10, step 166) and in actual applications. The orientation of the rearward portions of surfaces 251, 252, 253 and 254, for example, and other surface portions of the bezel shield 250, can influence the ability of the interim exhaust assembly design 230 to mitigate Coandă-related soot accumulation effects. Further, an adjustable plane (see, e.g., exhaust opening plane 20 in FIG. 2 and corresponding description) defined by the shield exhaust opening 250a can be adjusted in three dimensions using the parametric model 400 to mitigate Coandă-related soot accumulation effects and/or match the opening 250a to other aspects of the design of the exterior portions of the vehicle, including its fascia (see, e.g., fascia 4 in FIG. 2 and corresponding description). As a consequence, the parametric model 400 (see FIG. 10) can be employed at step 164 to quickly develop a meaningful interim exhaust assembly design 230 that is suitable for an evaluation of a particular exhaust assembly design concept.

Certain recitations contained herein refer to a component being "configured" in a particular way. In this respect, such recitations are structural recitations as opposed to recitations of intended use. More specifically, the references herein to the manner in which a component is "configured" denotes an existing physical condition of the component and, as such, is to be taken as a definite recitation of the structural characteristics of the component.

Variations and modifications can be made to the aforementioned structure without departing from the concepts of the present invention. Further, such concepts are intended to be covered by the following claims unless these claims by their language expressly state otherwise.

What is claimed is:

1. A method of designing an exhaust assembly, comprising the steps:
    developing an initial exhaust assembly design that comprises: an exhaust pipe having an exhaust pipe opening, the opening having an exhaust pipe height, and a bezel shield defining a shield exhaust opening aligned with the exhaust pipe opening, the shield exhaust opening having a shield exhaust height;
    evaluating the initial design based on a design guide;
    developing an interim exhaust assembly design based on the initial design and a parametric model;
    evaluating the interim design using a computational fluid dynamics model; and
    developing a final exhaust assembly design based on the parametric and the fluid dynamics models,
    wherein the design guide classifies a plurality of relationships between the exhaust pipe height and the shield exhaust height and requires the shield exhaust height to be greater than or equal to 1.2 times the exhaust pipe height.

2. The method according to claim 1, wherein the interim exhaust assembly design includes a plurality of surfaces governed by a plurality of corresponding mathematical relationships.

3. The method according to claim 1, wherein the evaluating step further comprises evaluating the interim design using a computational fluid dynamics model to minimize Coandă-related soot accumulation.

4. A method of designing an exhaust assembly, comprising the steps:
    developing an initial exhaust assembly design that comprises an exhaust pipe having an exhaust pipe opening, the opening having an exhaust pipe height, and a bezel shield defining a shield exhaust opening aligned with the exhaust pipe opening, the shield exhaust opening having a shield exhaust height;
    evaluating the initial design based on a design guide;
    developing a plurality of interim exhaust assembly designs based on the initial design and a parametric model;
    evaluating the plurality of interim designs using a computational fluid dynamics model; and
    developing a final exhaust assembly design based on the parametric and the fluid dynamics models,
    wherein the design guide requires the shield exhaust height to be greater than or equal to 1.2 times the exhaust pipe height.

5. The method according to claim 4, wherein the design guide classifies a plurality of relationships between the exhaust pipe height and the shield exhaust height.

6. The method according to claim 4, wherein the interim exhaust assembly design includes a plurality of surfaces governed by a plurality of corresponding mathematical relationships.

7. The method according to claim 4, wherein the evaluating step further comprises evaluating the interim design using a computational fluid dynamics model to minimize Coandă-related soot accumulation.

8. A method of designing an exhaust assembly, comprising the steps:
    developing an initial design having
        (a) an exhaust pipe extending rearward from a vehicle,
        (b) a bezel defining an exhaust opening aligned with the pipe, and
        (c) a bezel shield configured within the opening that extends rearward to at least the rearmost portion of the opening and parallel to an exit portion of the pipe; and
    evaluating the initial design based on a design guide,
    wherein the exhaust pipe defines an exhaust pipe opening having an exhaust pipe height, and the bezel shield defines a shield exhaust opening that is aligned with the exhaust pipe opening and has a shield exhaust height, and
    further wherein the design guide requires the shield exhaust height to be greater than or equal to 1.2 times the exhaust pipe height.

9. The method according to claim 8, wherein the design guide classifies a design relationship between the exhaust pipe height, the shield exhaust height and a distance between the centerlines of the exhaust pipe opening and the shield exhaust opening.

10. The method according to claim 8, wherein the design guide classifies a plurality of design relationships between the exhaust pipe height and the shield exhaust height.

* * * * *